United States Patent
Ahn

(10) Patent No.: US 10,013,028 B2
(45) Date of Patent: Jul. 3, 2018

(54) FOLDABLE DISPLAY DEVICE

(71) Applicant: SAMSUNG DISPLAY CO., LTD., Yongin-si, Gyeonggi-do (KR)

(72) Inventor: Sung Sang Ahn, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/608,242

(22) Filed: May 30, 2017

(65) Prior Publication Data
US 2017/0357289 A1    Dec. 14, 2017

(30) Foreign Application Priority Data
Jun. 9, 2016    (KR) .................. 10-2016-0071945

(51) Int. Cl.
| | |
|---|---|
| G06F 1/16 | (2006.01) |
| G02F 1/1333 | (2006.01) |
| G09F 9/30 | (2006.01) |
| H04M 1/02 | (2006.01) |
| B32B 3/26 | (2006.01) |
| G02B 26/00 | (2006.01) |
| H05K 5/02 | (2006.01) |
| H05K 5/00 | (2006.01) |

(52) U.S. Cl.
CPC ...... G06F 1/1652 (2013.01); G02F 1/133305 (2013.01); G06F 1/1641 (2013.01); G09F 9/301 (2013.01); H04M 1/0268 (2013.01); B32B 3/263 (2013.01); G02B 26/00 (2013.01); G06F 1/1643 (2013.01); H05K 5/0017 (2013.01); H05K 5/0217 (2013.01); H05K 2201/10128 (2013.01)

(58) Field of Classification Search
CPC .. G06F 1/1652; G02F 1/133305; G09F 9/301; H04M 1/0268
See application file for complete search history.

(56) References Cited

U.S. PATENT DOCUMENTS

| | | | | |
|---|---|---|---|---|
| 6,377,324 | B1 * | 4/2002 | Katsura | G02F 1/133305 349/58 |
| 6,577,496 | B1 * | 6/2003 | Gioscia | G06F 1/1616 345/156 |
| 8,804,349 | B2 * | 8/2014 | Lee | G06F 1/1641 361/749 |
| 9,337,434 | B2 * | 5/2016 | Lindblad | H01L 51/52 |

(Continued)

FOREIGN PATENT DOCUMENTS

| | | |
|---|---|---|
| KR | 10-2011-0100936 A | 9/2011 |
| KR | 10-2013-0073331 A | 7/2013 |

(Continued)

*Primary Examiner* — Adrian S Wilson
(74) *Attorney, Agent, or Firm* — Lee & Morse P.C.

(57) ABSTRACT

A foldable display device includes a flexible display panel including a first plane region, a second plane region, and a folding region positioned between the first plane region and the second plane region, a window on the flexible display panel, the window including an excess region that does not overlap the flexible display panel in at least one plane region direction of the first plane region and the second plane region based on the folding region while covering the flexible display panel, and a deformation preventing sheet overlapping the excess region of the window.

20 Claims, 13 Drawing Sheets

(56) References Cited

U.S. PATENT DOCUMENTS

| | | | |
|---|---|---|---|
| 2004/0183958 A1* | 9/2004 | Akiyama | G02F 1/133305 349/58 |
| 2005/0041012 A1* | 2/2005 | Daniel | G06F 1/1601 345/156 |
| 2006/0050169 A1* | 3/2006 | Misawa | G06F 1/1616 348/333.06 |
| 2006/0146488 A1* | 7/2006 | Kimmel | G06F 1/1616 361/679.04 |
| 2008/0079656 A1* | 4/2008 | Kee | G06F 1/1616 345/1.3 |
| 2010/0171683 A1* | 7/2010 | Huitema | G02F 1/13452 345/55 |
| 2011/0023344 A1 | 2/2011 | Penisson | |
| 2012/0002360 A1* | 1/2012 | Seo | G06F 1/1616 361/679.01 |
| 2016/0320804 A1* | 11/2016 | Takayanagi | G06F 1/1615 |
| 2017/0098668 A1* | 4/2017 | Huitema | H01L 27/1244 |

FOREIGN PATENT DOCUMENTS

| | | |
|---|---|---|
| KR | 10-1292974 B1 | 7/2013 |
| KR | 10-2014-0091274 A | 7/2014 |
| KR | 10-2014-0101274 A | 8/2014 |
| WO | WO 2015/116062 A1 | 8/2015 |

* cited by examiner

FOLDABLE DISPLAY DEVICE

CROSS-REFERENCE TO RELATED APPLICATION

Korean Patent Application No. 10-2016-0071945, filed on Jun. 9, 2016, in the Korean Intellectual Property Office, and entitled: "Foldable Display Device," is incorporated by reference herein in its entirety.

BACKGROUND

1. Field

Embodiments relate to a foldable display device that is capable of being folded or unfolded.

2. Description of the Related Art

A foldable display device uses a flexible display panel that may be bent. The foldable display device has a merit in that portability is simple when folded and a screen of a large size is realized when unfolded. By this merit, the foldable display device may be applied to various electronic devices, e.g., a television and a monitor, as well as mobile equipment, e.g., a mobile phone, an ultra-mobile PC, an E-book, an electronic newspaper, and the like.

SUMMARY

A foldable display device according to an exemplary embodiment includes a flexible display panel having a first plane region, a second plane region, and a folding region positioned between the first plane region and the second plane region; a window having an excess region that does not overlap the flexible display panel in at least one plane region direction of the first plane region and the second plane region based on the folding region while covering the flexible display panel; and a deformation preventing sheet overlapping the excess region of the window.

The deformation preventing sheet may include a metal material.

A first adhesive layer positioned between the flexible display panel and the window may be further included.

A supporting member supporting the flexible display panel, and a second adhesive layer positioned between the flexible display panel and the supporting member, may be further included.

The flexible display panel may be fixed to the supporting member by the second adhesive layer and the excess region, of the window may not be fixed to the supporting member.

The supporting member may include: a first supporting member corresponding to one of the first plane region and the second plane region; a second supporting member corresponding to the other of the first plane region and the second plane region; and a hinge part combining the first supporting member and the second supporting member, and the supporting member may be folded based on the hinge part so that the window is outward.

At least one of the first supporting member and the second supporting member may include a groove formed at a position corresponding to the excess region, and a magnet inserted in the groove.

A light blocking layer positioned under the excess region of the window may be further included, and the deformation preventing sheet may be positioned under the light blocking layer.

An area of the first plane region may be larger than an area of the second plane region.

The first plane region may include a first display region, the second plane region may include a second display region, and an area of the first display region may be the same as an area of the second display region.

A light blocking layer positioned under the window and enclosing the first display region and the second display region may be further included.

The first plane region may further include a pad region overlapping the light blocking layer.

The deformation preventing sheet may include a first deformation preventing sheet overlapping a first excess region adjacent to an edge of the second plane region.

A supporting member supporting the flexible display panel may be further included, and the supporting member may include a first groove formed at a position corresponding to the first excess region, and a first magnet inserted in the first groove.

The deformation preventing sheet may further include a second deformation preventing sheet overlapping a second excess region adjacent to the edge of the first plane region.

The supporting member may include a second groove formed at the position corresponding to the second excess region, and a second magnet inserted in the second groove.

A foldable display device according to another exemplary embodiment includes a flexible display panel including a first plane region, a second plane region, and a folding region positioned between the first plane region and the second plane region; and a window having an excess region that does not overlap the flexible display panel in at least one plane region direction of the first plane region and the second plane region based on the folding region while covering the flexible display panel, wherein a first thickness of the window in the excess region is thicker than a second thickness of the window in a region in contact with the flexible display panel.

The second thickness may be less than 100 μm, and the first thickness may be larger than 100 μm.

The window may include a deformation preventing sheet overlapping the excess region.

The deformation preventing sheet may include the metal material.

In the foldable display device, deformation of the window may be prevented.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
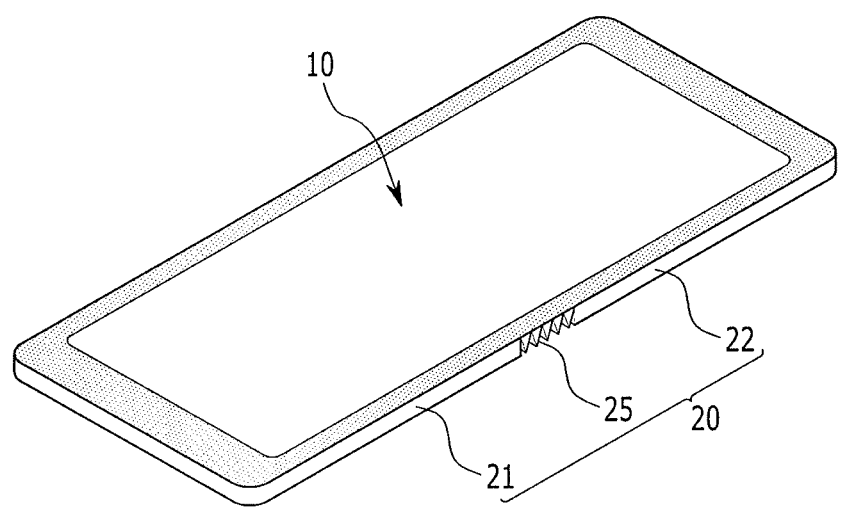
FIG. 1 illustrates a schematic perspective view of a foldable display device in an unfolded state according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Parts that are irrelevant to the description are omitted in order to clearly describe embodiments. In addition, unless explicitly described to the contrary, the word "comprise" and variations such as "comprises" or "comprising" will be understood to imply the inclusion of stated elements but not the exclusion of any other elements.

Now, a foldable display device according to an exemplary embodiment will be described with reference to FIGS. 1 to 7.

Figure 2:
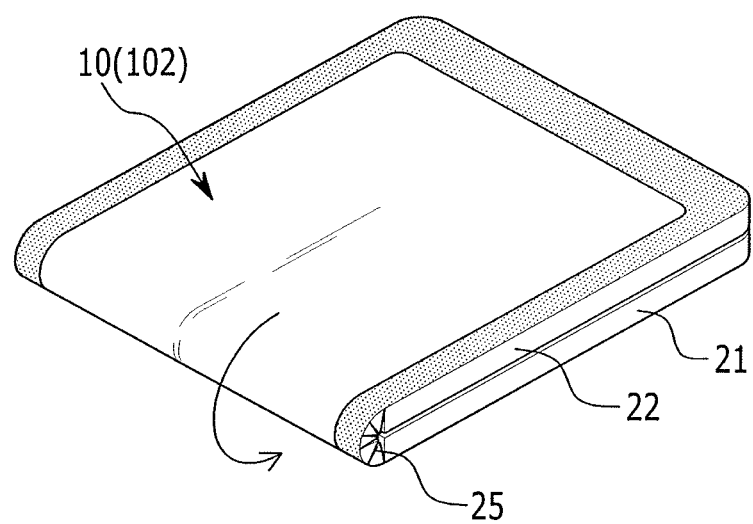
FIG. 2 illustrates a schematic perspective view of the foldable display device in FIG. 1 in a folded state.
Figure 3:
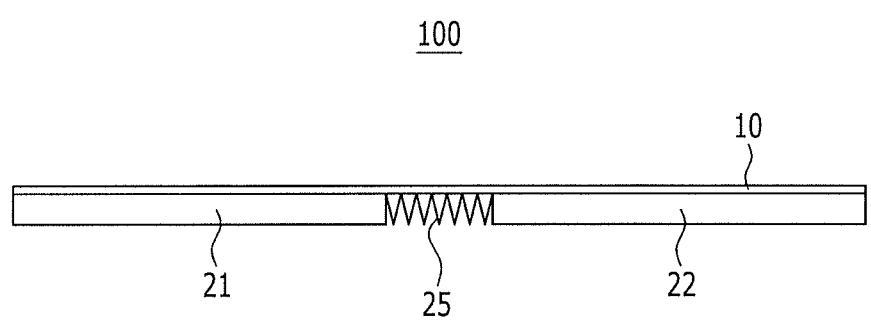
FIG. 3 illustrates a schematic side view of the foldable display device in FIG. 1 in an unfolded state.
Figure 4:
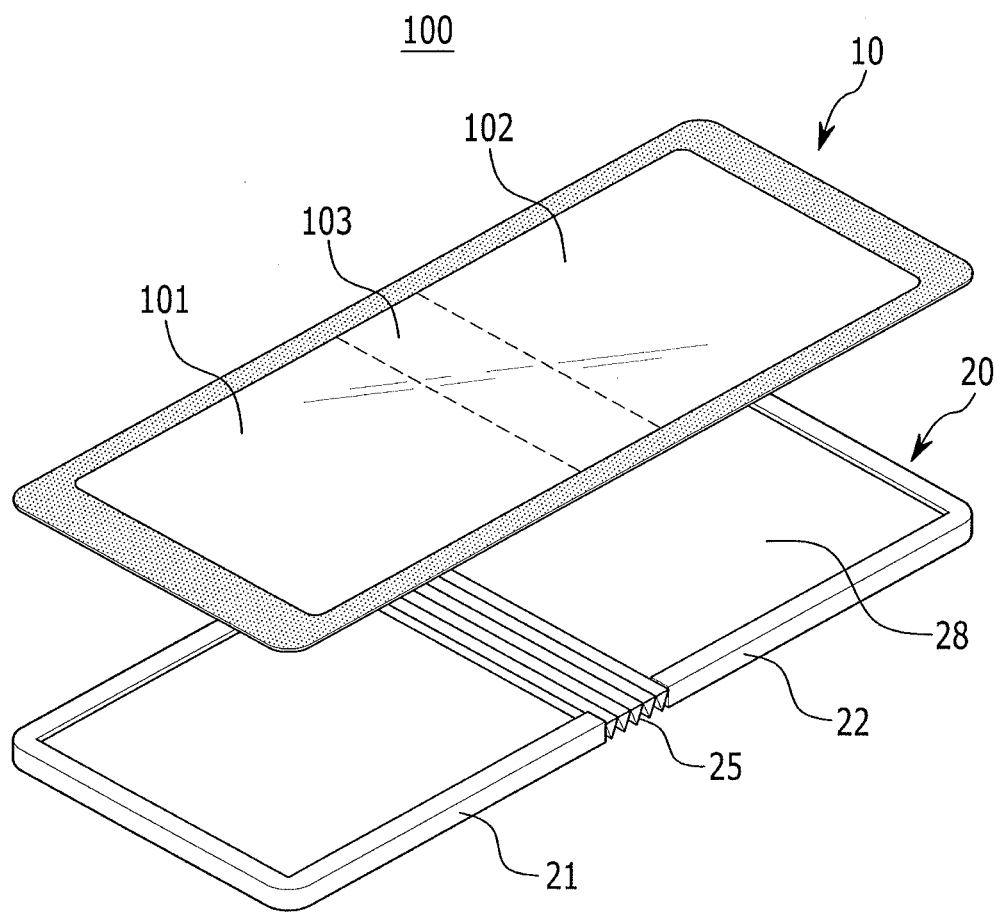
FIG. 4 illustrates an exploded perspective view of the foldable display device in FIG. 1.
Figure 5:
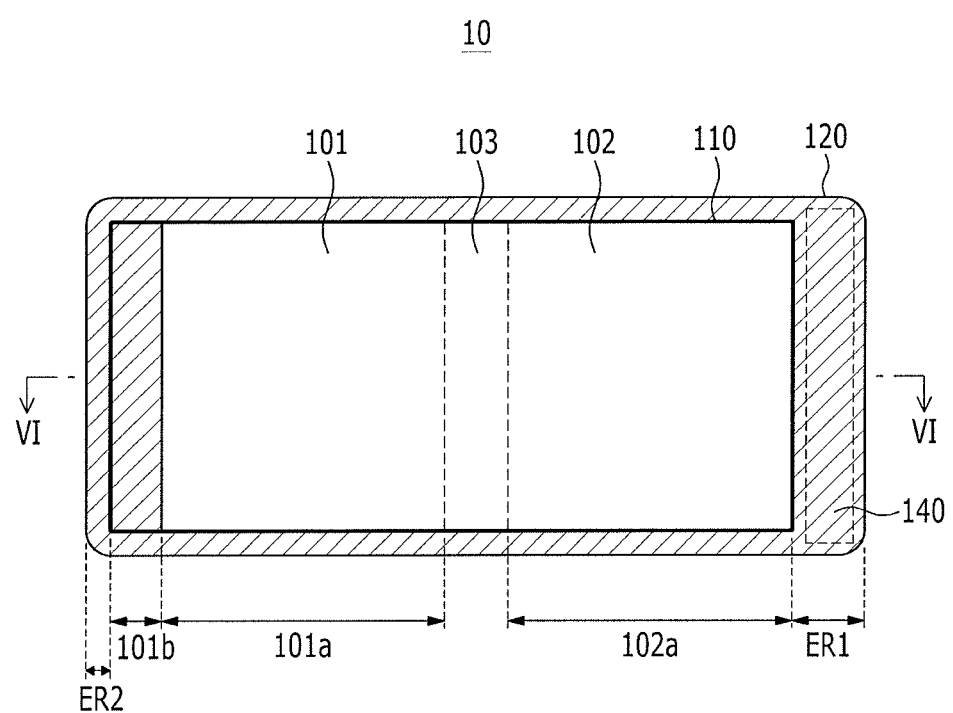
FIG. 5 illustrates a top plan view of a display module of the foldable display device of FIG. 1.
Figure 6:
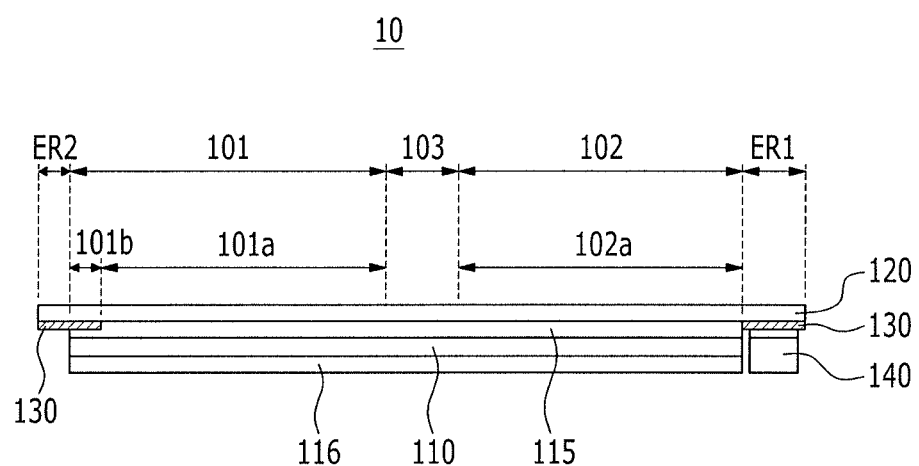
FIG. 6 illustrates a cross-sectional view along line VI-VI of FIG. 5.
Figure 7:
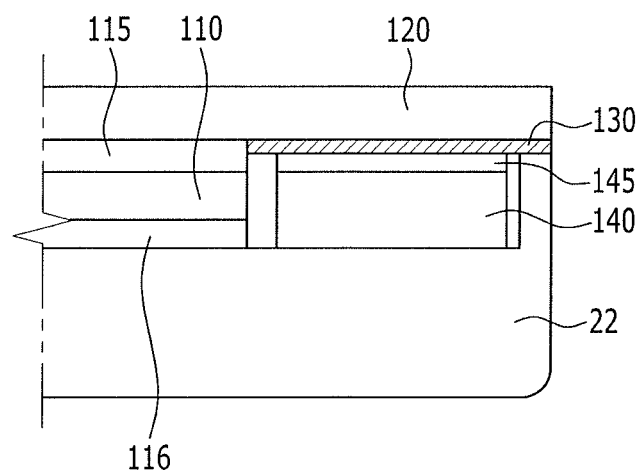
FIG. 7 illustrates a partially enlarged cross-sectional view of a part where a first deformation preventing sheet is positioned in the foldable display device of FIG. 1.

FIG. 1 is a perspective view schematically showing a foldable display device in an unfolded state according to an exemplary embodiment. FIG. 2 is a perspective view schematically showing the foldable display device in FIG. 1 in a folded state. FIG. 3 is a side view schematically showing the foldable display device of FIG. 1 in an unfolded state. FIG. 4 is an exploded perspective view of the foldable display device of FIG. 1. FIG. 5 is a top plan view showing a display module of the foldable display device of FIG. 1. FIG. 6 is a cross-sectional view along line VI-VI of FIG. 5. FIG. 7 is a partially enlarged cross-sectional view of a part where a first deformation preventing sheet is positioned in the foldable display device of FIG. 1.

Referring to FIGS. 1 to 7, a foldable display device 100 may include a display module 10 and a supporting member 20 supporting the display module 10. The supporting member 20 may include a first supporting member 21, a second supporting member 22, and a hinge part 25 combining the first supporting member 21 and the second supporting member 22.

In detail, referring to FIG. 4, the supporting member 20 includes the first supporting member 21 corresponding to a first plane region 101 of the display module 10, the second supporting member 22 corresponding to the second plane region 102 of the display module 10, and the hinge part 25 corresponding to a folding region 103 of the display module 10 and combining the first supporting member 21 and the second supporting member 22. The first supporting member 21 may support the first plane region 101 of the display module 10, the second supporting member 22 may support the second plane region 102 of the display module 10, and the hinge part 25 may support the folding region 103 of the display module 10. The display module 10 may be mounted to a mounting surface 28 of the supporting member 20 to be combined.

As shown in FIG. 2, the supporting member 20 may be combined so that the display module 10 faces outward based on the hinge part 25, e.g., with the hinge part 25 being internal with respect to the folded display nodule 10. That is, the supporting member 20 may be folded in a direction that the first supporting member 21 and the second supporting member 22 are in contact with each other based on the hinge part 25, e.g., and are facing each other. Further, when the supporting member 20 is folded, the display module 10 folds around the hinge part 25 to have the first plane region 101 and the second plane region 102 of the display module 10 on opposite sides of the resultant folded structure, e.g., not facing each other. As above-described, the foldable display device 100 may be an outward foldable display device of which the display module 10 is folded to be outward, e.g., being external in a folded state.

Here, it is shown that the hinge part 25 is formed of a structure made of a plurality of joints. However, the hinge part 25 may have a structure made of one axis, or two or more axes, and the structure of the hinge part 25 is not limited thereto in the present exemplary embodiment.

Referring to FIGS. 5-6, the display module 10 may include a flexible display panel 110, a window 120, a light blocking layer 130, and a first deformation preventing sheet 140.

The flexible display panel 110 includes a flexible film, e.g., a plastic film, and a plurality of pixels are formed on the flexible film to display an image. For example, an organic light emitting diode and a pixel circuit may be disposed on the flexible film to display the image.

The flexible display panel 110 includes the first plane region 101, the second plane region 102, and the folding region 103 positioned between the first plane region 101 and the second plane region 102. The first plane region 101 includes a first display region 101a and a pad region 101b. The second plane region 102 includes a second display region 102a. The image is displayed in the first display region 101a, the second display region 102a, and the folding region 103. The pad region 101b is a region where a pad and wiring are disposed to connect a driving IC generating a signal for driving of the pixel circuit and the flexible display panel 110.

An area of the first display region 101a and an area of the second display region 102a may be the same, e.g., in terms of shape and/or size. An area of the first plane region 101 of the flexible display panel 110 may be larger than an area of the second plane region 102 by an area of the pad region 101b.

The window 120 is disposed on the flexible display panel 110 to cover the flexible display panel 110. The window 120 has a function of protecting the flexible display panel 110 from the outside. The window 120 is manufactured of a transparent hard material, e.g., a polyimide (PI) or polyethylene terephthalate (PET), thereby transmitting the image of the flexible display panel 110.

The window 120 includes a region that is wider than the flexible display panel 110. In detail, as shown in FIG. 5, the window 120 may be provided to have a region that is wider (cross-hatched region in FIG. 5) than the region of the flexible display panel 110 (a region marked with a thick solid line in FIG. 5). Particularly, the window 120 may have excess regions ER1 and ER2 exceeding the region of the flexible display panel 110 in the plane region 101 and 102 direction of at least any one of the first plane region 101 and the second plane region 102 based on the folding region 103 while covering the flexible display panel 110. In other words, referring to FIGS. 5-6, the excess regions ER1 and ER2 may be regions of the window 120 that extend beyond edges of the flexible display panel 110 in a plane defined by the first and second plane regions 101 and 102, when the window 120 covers the flexible display panel 110. The excess regions ER1 and ER2 of the window 120 are outer regions of the region of the flexible display panel 110 among the region of the window 120.

As illustrated in FIG. 6, a first adhesive layer 115 is disposed between the flexible display panel 110 and the window 120. The flexible display panel 110 and the window 120 may be adhered by the first adhesive layer 115. The first adhesive layer 115 may include a pressure sensitive adhesive (PSA) or an optically clear adhesive (OCA). The first adhesive layer 115 is positioned on the flexible display panel 110 and may be formed to have the same area as that of the flexible display panel 110. That is, the first adhesive layer 115 is only formed on the flexible display panel 110, e.g., may completely overlap an entire surface of the flexible display panel 110 facing the window 120, but is not formed in the excess regions ER1 and ER2 of the window 120, and the excess regions ER1 and ER2 of the window 120 are not attached to the flexible display panel 110.

The window 120 may overlap the flexible display panel 110 so that both sides thereof may be symmetrical based on the folding region 103. That is, when folding the foldable display device 100 based on the folding region 103, the flexible display panel 110 and the window 120 may overlap each other so that both ends of the window 120 are matched to each other. On the other hand, since the first plane region 101 has the larger area than the second plane region 102 by the area of the pad region 101*b* in the flexible display panel 110, when folding the foldable display device 100 based on the folding region 103, ends of the flexible display panel 110 may not be matched to each other.

As illustrated in FIG. 7, under the flexible display panel 110, a second adhesive layer 116 is positioned between the flexible display panel 110 and the supporting member 20. The flexible display panel 110 may be adhered to the supporting member 20 by the second adhesive layer 116. The second adhesive layer 116 may include the PSA or the OCA.

Referring to FIG. 6, the light blocking layer 130 is positioned under the window 120 and defines the first display region 101*a* and the second display region 102*a* of the flexible display panel 110. That is, the light blocking layer 130 encloses the first display region 101*a* and the second display region 102*a* of the flexible display panel 110. The light blocking layer 130 may be printed at a position corresponding to, e.g., overlapping, the excess regions ER1 and ER2 of the window 120 and the pad region 101*b* of the flexible display panel 110. The light blocking layer 130 is positioned between the flexible display panel 110 and the window 120, e.g., on a surface of the window 120 facing the flexible display panel 110.

Referring to FIGS. 6-7, the first deformation preventing sheet 140 overlaps the first excess region ER1 of the window 120 adjacent to the edge of the second plane region 102, and has a function of preventing deformation of the part of the first excess region ER1 of the window 120 that is not adhered to the flexible display panel 110. For example, the first deformation preventing sheet 140 may be adhered to the first excess region ER1 of the window 120 with a shape that is parallel to one side of the first excess region ER1 of the window 120, e.g., the first deformation preventing sheet 140 may have a shape overlapping a majority of the first excess region ER1. In another example, the first deformation preventing sheet 140 may be adhered to the first excess region ER1 of the window 120 with a shape that is parallel to the folding region 103, e.g., the first deformation preventing sheet 140 may have a shape extending in parallel to the folding region 103.

In detail, as illustrated in FIG. 7, the first deformation preventing sheet 140 may be positioned under the light blocking layer 130 of the first excess region ER1. In this case, a third adhesive layer 145 is positioned between the window 120 and the first deformation preventing sheet 140. The window 120 and the first deformation preventing sheet 140 may be adhered by the third adhesive layer 145. That is, the first deformation preventing sheet 140 may be adhered under the light blocking layer 130 of the first excess region ER1 of the window 120 by the third adhesive layer 145. The third adhesive layer 145 may include the PSA or the OCA. The first deformation preventing sheet 140 may be a metal sheet including a metal material, e.g., at least one of iron (Fe), copper (Cu), and aluminum (Al).

The thickness of the first deformation preventing sheet 140 may be determined so that a total deposition thickness of the window 120 of the first excess region ER1, the light blocking layer 130, the third adhesive layer 145, and the first deformation preventing sheet 140 and a total deposition thickness of the window 120 of the plane regions 101 and 102, the first adhesive layer 115, the flexible display panel 110, and the second adhesive layer 116 are matched, e.g., equal to each other. In this case, the thickness of the window 120 may be less than 100 μm, and the total deposition thickness of the window 120 of the first excess region ER1, the light blocking layer 130, the third adhesive layer 145, and the first deformation preventing sheet 140 may be larger than 100 μm. The first deformation preventing sheet 140 is positioned on the second supporting member 22 of the supporting member 20, and the first deformation preventing sheet 140 is not adhered to the supporting member 20. That is, the flexible display panel 110 is fixed to the supporting member 20, however the first excess region ER1 of the window 120 is not fixed to the supporting member 20, e.g., the first deformation preventing sheet 140 may be attached to the window 120 while being positioned on the second supporting member 22 without being attached to the second supporting member 22. For example, as illustrated in FIG. 7, the first deformation preventing sheet 140 may, e.g., completely, fill a space between the third adhesive 145 and the second supporting member 22 along a vertical direction, and may be spaced apart from the flexible display panel 110.

Referring to FIG. 2, when the foldable display device 100 is folded based on the hinge part 25 so that the window 120 faces outwardly, a larger tension is generated at the outer surface of the window 120 opposite to the inner surface in contact with the flexible display panel 110 than at the inner surface. In other words, a larger tension is generated at the outer surface of the window 120 facing outwardly than at a surface of the window 120 facing the supporting members 21, 22 of the flexible display panel 110.

If the first deformation preventing sheet 140 is not adhered to the window 120, deformation of the first excess region ER1, which extends beyond the flexible display panel 110 and is not adhered to the flexible display panel 110, may be generated. In detail, while both sides of the window 120 are symmetrical based on the folding region 103, the first excess region ER1 of the second plane region 102 side is larger than the second excess region ER2 of the first plane region 101 side because the first plane region 101 of the flexible display panel 110 has a larger area than the second plane region 102 based on the folding region 103. As such, deformation of the first excess region ER1 part of the second plane region 102 side may be largely generated. Further, if the first excess region ER1 of the window 120 were to be directly adhered to the supporting member 20 to prevent such deformation, the window 120 could be damaged by the resultant tension.

In contrast, according to the present exemplary embodiment, as the first deformation preventing sheet 140 is adhered to the first excess region ER1 of the window 120 of the second plane region 102 side, the deformation of the first excess region ER1 part of the window 120 of the second plane region 102 may be prevented. That is, according to the present exemplary embodiment, when the first deformation preventing sheet 140 is adhered to the first excess region ER1 of the window 120, the deformation of the first excess region ER1 of the window 120 may be prevented without the damage of the window 120. In other words, since the first deformation preventing sheet 140 has a function of increasing the thickness of the first excess region ER1 of the window 120 that is not in contact with the flexible display panel 110, the thickness (e.g., of greater than 100 μm) of the window 120 in the first excess region ER1 is substantially larger than the thickness (e.g., of less than 100 μm) of the window 120 in the region in contact with the flexible display panel 110. Accordingly, the deformation of the first excess region ER1 of the window 120 may be prevented.

Next, a foldable display device according to another exemplary embodiment will be described in detail with reference to FIGS. 8 and 9. Differences from the foldable display device described in FIGS. 1 to 7 will be mainly described, and the description of same constituent elements is omitted.

Figure 8:
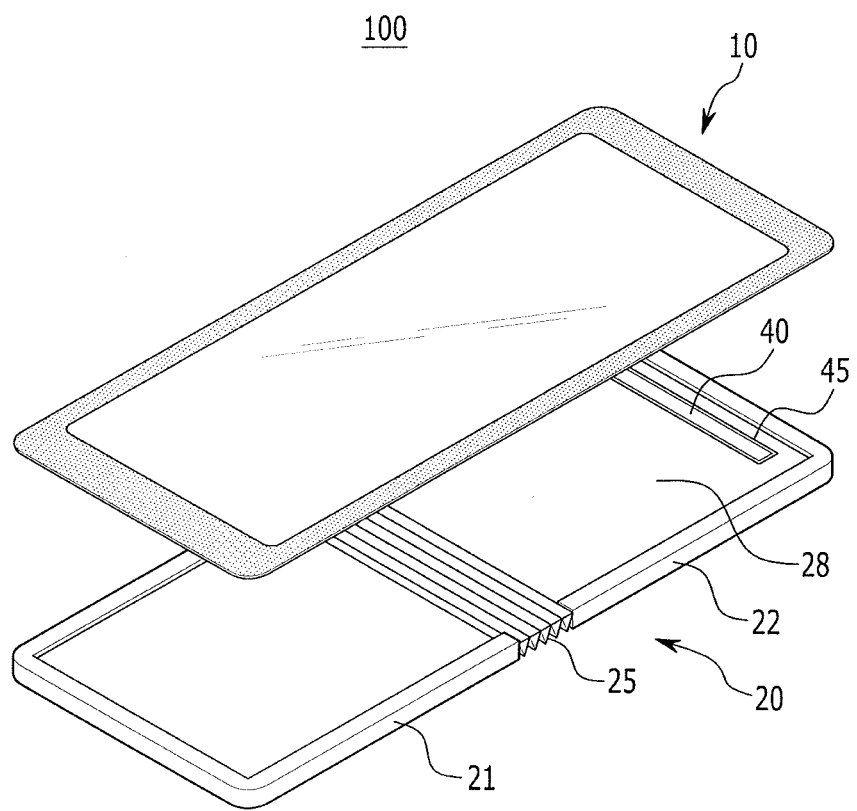
FIG. 8 illustrates an exploded perspective view of a foldable display device according to an exemplary embodiment.

FIG. 8 is an exploded perspective view of a foldable display device according to an exemplary embodiment. FIG. 9 is a partially enlarged cross-sectional view of a part where a first magnet is positioned in the foldable display device of FIG. 8.

Figure 9:
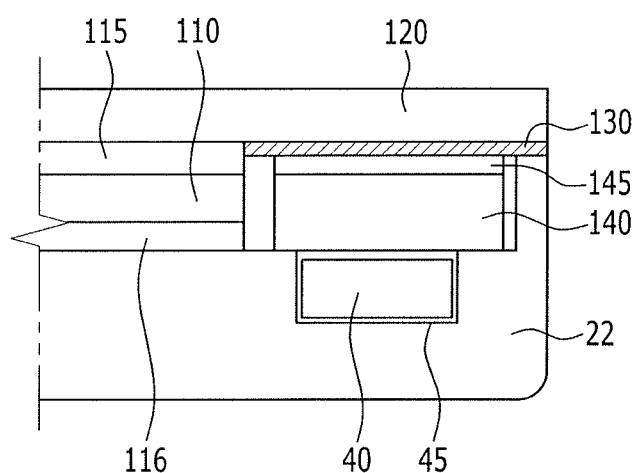
FIG. 9 illustrates a partially enlarged cross-sectional view of a part where a first magnet is positioned in the foldable display device of FIG. 8.

Referring to FIGS. 8 and 9, the foldable display device 100 may further include a first groove 45 formed in the second supporting member 22 and a first magnet 40 inserted in the first groove 45.

The first groove 45 may be formed at a position corresponding to, e.g., overlapping, the first excess region ER1 of the window 120 of the second plane region 102 side. The first groove 45 may be formed along one side of the first excess region ER1 of the window 120. The first groove 45 may be formed in the direction parallel to the folding region 103 of the flexible display panel 110.

The first magnet 40 may be inserted in the first groove 45 to be fixed in the first groove 45. The first magnet 40 faces the first deformation preventing sheet 140 positioned at the first excess region ER1 of the window 120 of the second plane region 102 side. The first deformation preventing sheet 140 may include, e.g., iron (Fe), and the first magnet 40 generates attraction to the first deformation preventing sheet 140 by magnetism. Accordingly, the first deformation preventing sheet 140 receives the attraction to the first magnet 40 side, and the deformation of the first excess region ER1 of the window 120, in which the first deformation preventing sheet 140 is positioned, may be further strongly prevented.

Next, a foldable display device according to another exemplary embodiment will be described in detail with reference to FIGS. 10 to 12. The differences from the foldable display device described in FIGS. 1 to 7 and the foldable display device described in FIGS. 8 and 9 will be mainly described, and description of same constituent elements is omitted.

Figure 10:
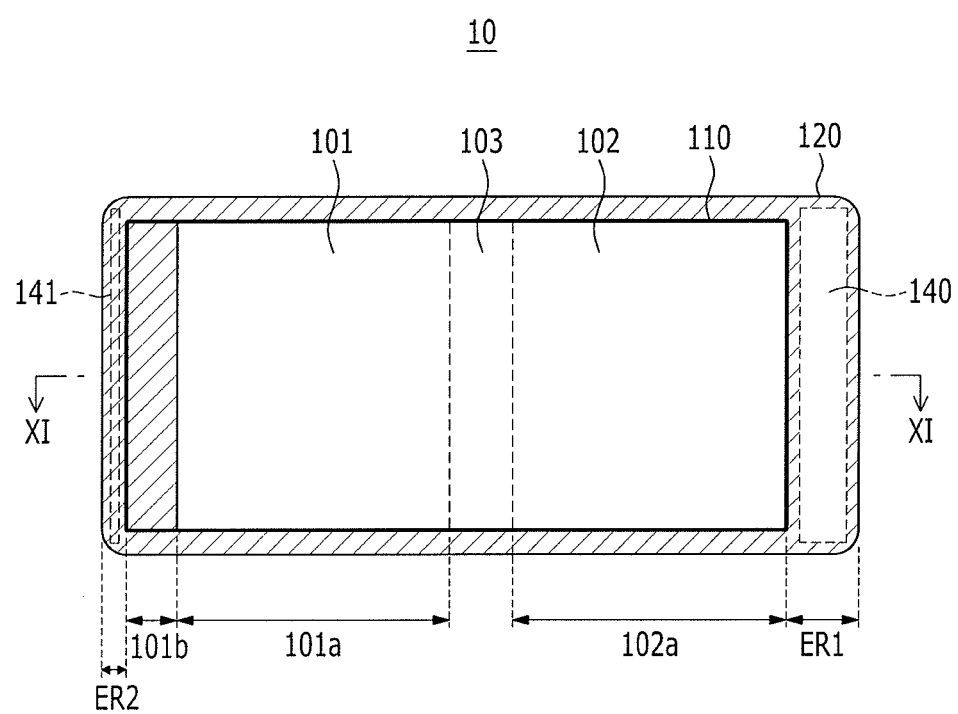
FIG. 10 illustrates a top plan view of a display module of a foldable display device according to an exemplary embodiment.

FIG. 10 is a top plan view showing a display module of a foldable display device according to an exemplary embodiment. FIG. 11 is a cross-sectional view of a display module taken along line XI-XI of FIG. 10. FIG. 12 is a partially enlarged cross-sectional view of a part where a second deformation preventing sheet is positioned in the foldable display device according to the exemplary embodiment of FIG. 10.

Figure 11:
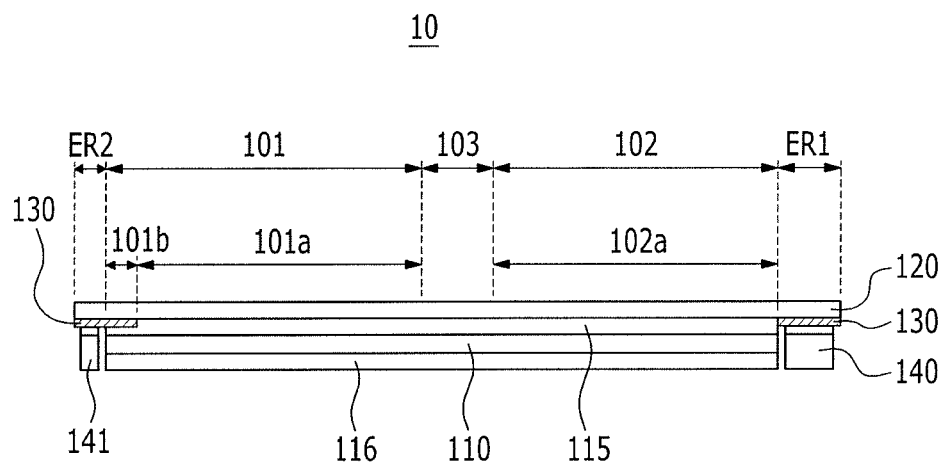
FIG. 11 illustrates a cross-sectional view along line XI-XI of FIG. 10.
Figure 12:
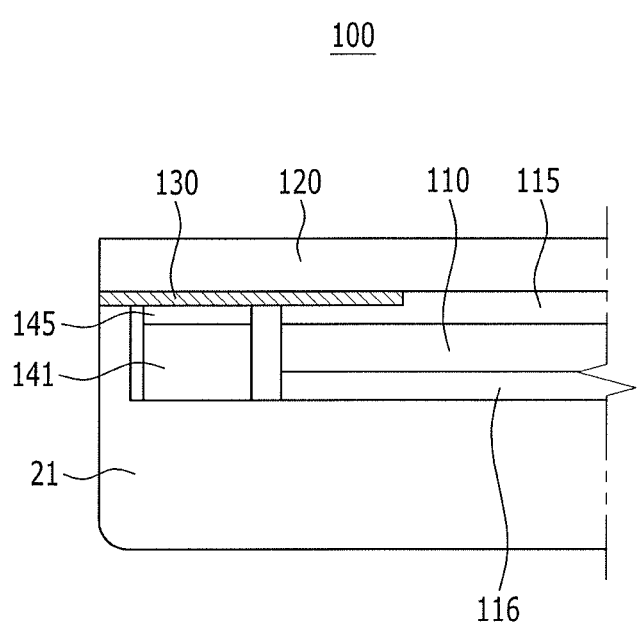
FIG. 12 illustrates a partially enlarged cross-sectional view of a part where a second deformation preventing sheet is positioned in the foldable display device of FIG. 10.

Referring to FIGS. 10 to 12, the foldable display device 100 may further include a second deformation preventing sheet 141 overlapping the second excess region ER2 of the window 120 adjacent to the edge of the first plane region 101 of the flexible display panel 110. The second deformation preventing sheet 141 overlaps and is adhered to the second excess region ER2 of the window 120 adjacent to the edge of the first plane region 101, and has the function of preventing the deformation of the second excess region ER2 part of the window 120 that is not adhered to the flexible display panel 110.

In detail, the second deformation preventing sheet 141 may be overlapped with the shape that is parallel to one side of the second excess region ER2 of the window 120. The second deformation preventing sheet 141 may overlap and may be adhered to the second excess region ER2 of the window 120 with the shape parallel to the folding region 103. The second deformation preventing sheet 141 may be adhered under the light blocking layer 130 of the second excess region ER2. In this case, the third adhesive layer 145 may be positioned between the window 120 and the second deformation preventing sheet 141. The window 120 and the second deformation preventing sheet 141 may be adhered to each other by the third adhesive layer 145. That is, the second deformation preventing sheet 141 may be adhered under the light blocking layer 130 of the second excess region ER2 of the window 120 by the third adhesive layer 145. The second deformation preventing sheet 141 may be the metal sheet including a metal material, e.g., iron (Fe), copper (Cu), aluminum (Al), and the like.

The thickness of the second deformation preventing sheet 141 may be determined so that the deposition thickness of the window 120 of the second excess region ER2, the light blocking layer 130, the third adhesive layer 145, and the second deformation preventing sheet 141 and the deposition thickness of the window 120 of the plane regions 101 and 102, the first adhesive layer 115, the flexible display panel 110, and the second adhesive layer 116 may be matched. In this case, the thickness of the window 120 may be less than 100 μm, and the deposition thickness of the window 120 of the second excess region ER2, the light blocking layer 130, the third adhesive layer 145, and the second deformation preventing sheet 141 may be larger than 100 μm. The second deformation preventing sheet 141 is positioned on the first supporting member 21 of the supporting member 20, and the second deformation preventing sheet 141 is not adhered to the supporting member 20. As the second deformation preventing sheet 141 is adhered to the second excess region ER2 of the window 120 of the first plane region 101 side, the deformation of the second excess region ER2 part of the window 120 of the first plane region 101 side may be prevented.

Next, a foldable display device according to another exemplary embodiment will be described in detail with reference to FIG. 13. The differences relative to the foldable display device described in FIG. 10 will be mainly described and description of same constituent elements is omitted.

Figure 13:
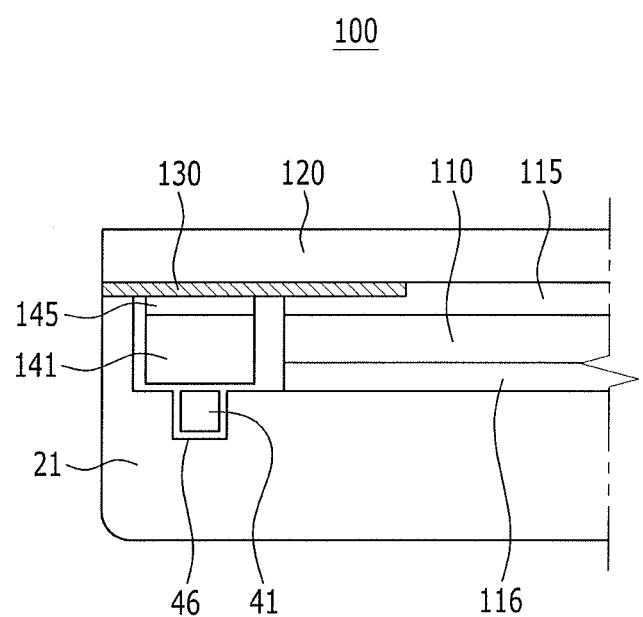
FIG. 13 illustrates a partial cross-sectional view showing another exemplary embodiment for a part where a second deformation preventing sheet is positioned in the foldable display device of FIG. 10.

FIG. 13 is a partial cross-sectional view showing another exemplary embodiment for a part where a second deformation preventing sheet is positioned in the foldable display device according to the exemplary embodiment of FIG. 10.

Referring to FIG. 13, the foldable display device 100 further includes a second groove 46 formed in the first supporting member 21 and a second magnet 41 installed in the second groove 46. The second groove 46 may be formed at the position corresponding to the second excess region ER2 of the window 120 of the first plane region 101. The second groove 46 may be formed along one side of the second excess region ER2 of the window 120. The second groove 46 may be formed in the direction parallel to the folding region 103 of the flexible display panel 110.

The second magnet 41 may be inserted in the second groove 46 to be fixed in the second groove 46. The second magnet 41 faces the second deformation preventing sheet 141 positioned at the second excess region ER2 of the window 120 of the first plane region 101 side. The second deformation preventing sheet 141 may include iron (Fe), and the second magnet 41 generates the attraction to the second deformation preventing sheet 141 by the magnetism. Accordingly, the second deformation preventing sheet 141 receives the attraction in the second magnet 41 side, and the deformation of the second excess region ER2 of the window 120 to which the second deformation preventing sheet 141 is adhered may be further strongly prevented.

By way of summation and review, when folding a foldable display device, an outer surface of a flexible display panel is stretched and is under tension. As such, the outer surface of a window protecting the flexible display panel is also stretched and is under tension. However, the tension acting on the outer surface of the window may cause deformation of the window. In particular, an edge part of the window may be lifted due to the tension.

In contrast, according to embodiments, a foldable display device includes a deformation preventing sheet under an edge of the window. That is, the deformation preventing sheet may be under an edge of the window that extends beyond the display panel to prevent the edge from lifting. Accordingly, the edge of the window is prevented from being lifted, thereby preventing deformation of the window.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A foldable display device, comprising:
   a flexible display panel including a first plane region, a second plane region, and a folding region positioned between the first plane region and the second plane region;
   a window on the flexible display panel, the window including an excess region that does not overlap the flexible display panel in at least one plane region direction of the first plane region and the second plane region based on the folding region while covering the flexible display panel; and
   a deformation preventing sheet overlapping the excess region of the window.

2. The foldable display device as claimed in claim 1, wherein the deformation preventing sheet includes a metal material.

3. The foldable display device as claimed in claim 1, further comprising a first adhesive layer positioned between the flexible display panel and the window.

4. The foldable display device as claimed in claim 3, further comprising:
   a supporting member to support the flexible display panel; and
   a second adhesive layer positioned between the flexible display panel and the supporting member.

5. The foldable display device as claimed in claim 4, wherein the flexible display panel is fixed to the supporting member by the second adhesive layer, the excess region of the window not being fixed to the supporting member.

6. The foldable display device as claimed in claim 4, wherein the supporting member includes:
   a first supporting member corresponding to the first plane region;
   a second supporting member corresponding to the second plane region; and
   a hinge part combining the first supporting member and the second supporting member, the supporting member being folded based on the hinge part so that the window is facing outwardly.

7. The foldable display device as claimed in claim 6, wherein at least one of the first supporting member and the second supporting member includes:
   a groove at a position corresponding to the excess region; and
   a magnet in the groove.

8. The foldable display device as claimed in claim 1, further comprising a light blocking layer positioned under the excess region of the window, the deformation preventing sheet being under the light blocking layer.

9. The foldable display device as claimed in claim 1, wherein an area of the first plane region is larger than an area of the second plane region.

10. The foldable display device as claimed in claim 9, wherein the first plane region includes a first display region, the second plane region includes a second display region, and an area of the first display region is the same as an area of the second display region.

11. The foldable display device as claimed in claim 10, further comprising a light blocking layer positioned under the window and enclosing the first display region and the second display region.

12. The foldable display device as claimed in claim 11, wherein the first plane region further includes a pad region overlapping the light blocking layer.

13. The foldable display device as claimed in claim 9, wherein the deformation preventing sheet includes a first deformation preventing sheet overlapping a first excess region adjacent to an edge of the second plane region.

14. The foldable display device as claimed in claim 13, further comprising a supporting member to support the flexible display panel, the supporting member including:
   a first groove at a position corresponding to the first excess region; and
   a first magnet in the first groove.

15. The foldable display device as claimed in claim 14, wherein the deformation preventing sheet further includes a second deformation preventing sheet overlapping a second excess region adjacent to an edge of the first plane region.

16. The foldable display device as claimed in claim 15, wherein the supporting member includes:
   a second groove at a position corresponding to the second excess region; and
   a second magnet in the second groove.

17. A foldable display device, comprising:
   a flexible display panel including a first plane region, a second plane region, and a folding region between the first plane region and the second plane region; and
   a window on the flexible display panel, the window including an excess region that does not overlap the flexible display panel in at least one plane region direction of the first plane region and the second plane region based on the folding region while covering the flexible display panel,
   wherein a first thickness of the window in the excess region is thicker than a second thickness of the window in a region in contact with the flexible display panel.

18. The foldable display device as claimed in claim 17, wherein the second thickness is less than 100 μm, and the first thickness is larger than 100 μm.

19. The foldable display device as claimed in claim 17, wherein the window includes a deformation preventing sheet overlapping the excess region.

20. The foldable display device as claimed in claim 19, wherein the deformation preventing sheet includes a metal material.

* * * * *